(12) United States Patent
Wu et al.

(10) Patent No.: US 9,036,413 B2
(45) Date of Patent: May 19, 2015

(54) FLASH MEMORY REFERENCE VOLTAGE DETECTION WITH TRACKING OF CROSS-POINTS OF CELL VOLTAGE DISTRIBUTIONS USING HISTOGRAMS

(71) Applicant: LSI Corporation, San Jose, CA (US)

(72) Inventors: Yunxiang Wu, Cupertino, CA (US); Abdel-Hakim Alhussien, San Jose, CA (US); Zhengang Chen, San Jose, CA (US); Sundararajan Sankaranarayanan, Fremont, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 40 days.

(21) Appl. No.: 14/059,229

(22) Filed: Oct. 21, 2013

(65) Prior Publication Data

US 2015/0092489 A1    Apr. 2, 2015

Related U.S. Application Data

(60) Provisional application No. 61/883,491, filed on Sep. 27, 2013.

(51) Int. Cl.
*G11C 16/04*    (2006.01)
*G11C 16/10*    (2006.01)

(52) U.S. Cl.
CPC .................................. *G11C 16/10* (2013.01)

(58) Field of Classification Search
USPC ............................................ 365/185.03, 185.2
See application file for complete search history.

(56) References Cited

U.S. PATENT DOCUMENTS

| | | | |
|---|---|---|---|
| 8,289,781 B2 | 10/2012 | Litsyn et al. | |
| 8,351,258 B1 | 1/2013 | Yang | |
| 8,416,623 B2 | 4/2013 | Yang | |
| 2013/0163328 A1 | 6/2013 | Karakulak et al. | |
| 2014/0040531 A1* | 2/2014 | Wu et al. ....................... | 711/103 |
| 2014/0119113 A1* | 5/2014 | Xia et al. ................... | 365/185.03 |

* cited by examiner

*Primary Examiner* — Hoai V Ho
(74) *Attorney, Agent, or Firm* — Daniel J. Santos; Smith Risley Tempel Santos LLC

(57) ABSTRACT

Cross-points of flash memory cell voltage distributions are determined by reading data from a portion of the flash memory two or more times using two or more different candidate reference voltages and determining corresponding decision patterns. The frequency of occurrence of the decision patterns in the data read from the flash memory is used to conceptually construct a histogram. The histogram is used to estimate the cross-points. Employing decision patterns enables multiple cross-point voltages to be determined with a minimum of read operations.

20 Claims, 7 Drawing Sheets

US 9,036,413 B2

FLASH MEMORY REFERENCE VOLTAGE DETECTION WITH TRACKING OF CROSS-POINTS OF CELL VOLTAGE DISTRIBUTIONS USING HISTOGRAMS

CROSS-REFERENCE TO RELATED APPLICATION

The benefit of the filing date of U.S. Provisional Patent Application No. 61/883,491, filed Sep. 27, 2013, entitled "FLASH MEMORY REFERENCE VOLTAGE DETECTION WITH TRACKING OF CROSS-POINTS OF CELL VOLTAGE DISTRIBUTIONS USING HISTOGRAMS," is hereby claimed and the specification thereof incorporated herein in its entirety by this reference.

FIELD OF INVENTION

The invention relates generally to flash memory controllers and, more specifically, to reference voltage detection in flash memory controllers.

BACKGROUND

A flash memory is a non-volatile electrically erasable data storage device that evolved from electrically erasable programmable read-only memory (EEPROM). The two main types of flash memory are named after the logic gates that their storage cells resemble: NAND and NOR. NAND flash memory is commonly used in solid-state drives, which are supplanting magnetic disk drives in many applications. A NAND flash memory is commonly organized as multiple blocks, with each block organized as multiple pages. Each page comprises multiple cells. Each cell is capable of storing an electric charge. Some cells are used for storing data bits, while other cells are used for storing error-correcting code (ECC) bits. A cell configured to store a single bit is known as a single-level cell (SLC). A cell configured to store two bits is known as a multi-level cell (MLC). In an MLC cell, one bit is commonly referred to as the least-significant bit (LSB), and the other as the most-significant bit (MSB). A cell configured to store three bits is known as a triple-level cell (TLC). Writing data to a flash memory is commonly referred to as "programming" the flash memory, due to the similarity to programming an EEPROM.

The electric charge stored in a cell can be detected in the form of a cell voltage. To read an SLC flash memory cell, the flash memory controller provides one or more reference voltages (also referred to as read voltages) to the flash memory device. Detection circuitry in the flash memory device will interpret the bit as a "0" if the cell voltage is greater than a reference voltage Vref and will interpret the bit as a "1" if the cell voltage is less than the reference voltage Vref. Thus, an SLC flash memory requires a single reference voltage Vref. In contrast, an MLC flash memory requires three such reference voltages, and a TLC flash memory requires seven such reference voltages. Thus, reading data from an MLC or TLC flash memory device requires that the controller provide multiple reference voltages having optimal values that allow the memory device to correctly detect the stored data values.

Determining or detecting stored data values using controller-provided reference voltages is hampered by undesirable physical non-uniformity across cells of a device that are inevitably introduced by the fabrication process, as such non-uniformity results in the reference voltages of different cells that store the same bit value being significantly different from each other. The detection is further hampered by reference voltages changing over time due to adverse effects of changes in temperature, interference from programming neighboring cells, and numerous erase-program cycles. Errors in detecting stored data values are reflected in the performance measurement known as bit error rate (BER). The use of ECC can improve BER to some extent, but the effectiveness of ECC diminishes as improved fabrication processes result in smaller cell features.

Conventional methods for aiding the detection of stored data values using reference voltages commonly rely upon an assumption that the reference voltage windows for a device have Gaussian distributions. As illustrated in FIG. 1, an MLC flash memory has four cell voltage distributions 102, 104, 106 and 108 with four respective mean target cell voltages Vtarget0 112, Vtarget1 114, Vtarget2 116 and Vtarget3 118. Such cell voltage distributions commonly overlap each other slightly, but such overlap is not shown in FIG. 1 for purposes of clarity. During a read operation, to attempt to characterize or detect the two bits of cell data (i.e., the least-significant bit (LSB) and most-significant bit (MSB)) a flash memory device (not shown) uses three reference voltages it receives from a flash memory controller (not shown): Vref0 122, Vref1 124 and Vref2 126. More specifically, the flash memory device compares the cell voltage with Vref1 124 to attempt to detect the LSB. If the flash memory device determines that the cell voltage is less than Vref1 124, i.e., within a window 128, then the flash memory device characterizes the LSB as a "1". If the flash memory device determines that the cell voltage is greater than Vref1 124, i.e., within a window 130, then the flash memory device characterizes the LSB as a "0". The flash memory device also compares the cell voltage with Vref0 122 and Vref2 126 to attempt to detect the MSB. If the flash memory device determines that the cell voltage is between Vref0 122 and Vref2 126, i.e., within a window 132, then the flash memory device characterizes the MSB as a "0". If the flash memory device determines that the cell voltage is either less than Vref0 122 or greater than Vref2 126, i.e., within a window 134, then the flash memory device characterizes the MSB as a "1".

Conventional methods for determining optimal values for the reference voltages include the flash memory controller periodically performing a calibration in which the controller reads data from the flash memory and uses an analysis of the results to adjust the estimated reference voltages. In a conventional method, the reference voltages Vref0, Vref1 and Vref2 are adjusted one at a time, which can be slow. It would be desirable to provide a faster or otherwise improved method for determining reference voltages for a flash memory device.

SUMMARY

Embodiments of the invention relate to a flash memory controller in which cross-points of cell voltage distributions are determined, such that the cross-points can be used in read data detection. In accordance with an exemplary embodiment of the invention, a method of operation in a flash memory controller includes: reading data from a portion of a flash memory N times using N different candidate reference voltages, each time reading data from the portion of the flash memory using a different candidate reference voltage from all other times, wherein the N different candidate reference voltages are distributed over a voltage range that is centered on an estimated mid-point between a pair of adjacent target cell voltages; determining N+1 decision patterns, each decision pattern corresponding to a voltage region bordering one of the candidate reference voltages; counting occurrences of each of the N+1 decision patterns in the data read from the portion of the flash memory; determining one or more decision patterns having a minimum of occurrences; determining a cross-point voltage corresponding to a mid-point of one or more voltage regions corresponding to the one or more decision patterns determined to have a minimum of occurrences; and providing an indication of the cross-point voltage to a read data detector.

Also in accordance with the exemplary embodiment, a flash memory controller includes a buffer memory and a processing system. The processing system includes: read data logic for reading data into the buffer memory from a portion of a flash memory N times using N different candidate reference voltages, where N is an integer greater than one, each time reading data from the portion of the flash memory using a different candidate reference voltage from all other times, the N different candidate reference voltages distributed over a voltage range, the voltage range centered on an estimated mid-point between a pair of adjacent target cell voltages; decision pattern logic for determining N+1 decision patterns, each decision pattern corresponding to a voltage region bordering one of the candidate reference voltages; histogram logic for counting occurrences of each of the N+1 decision patterns in the data read from the portion of the flash memory, the decision pattern logic further determining one or more decision patterns having a minimum of occurrences; cross-point estimation logic for determining a cross-point voltage corresponding to a mid-point of one or more voltage regions corresponding to the one or more decision patterns determined to have a minimum of occurrences; and read data detection logic for receiving from the cross-point estimation logic an indication of the cross-point voltage.

WRITTEN DESCRIPTION

Figure 1:
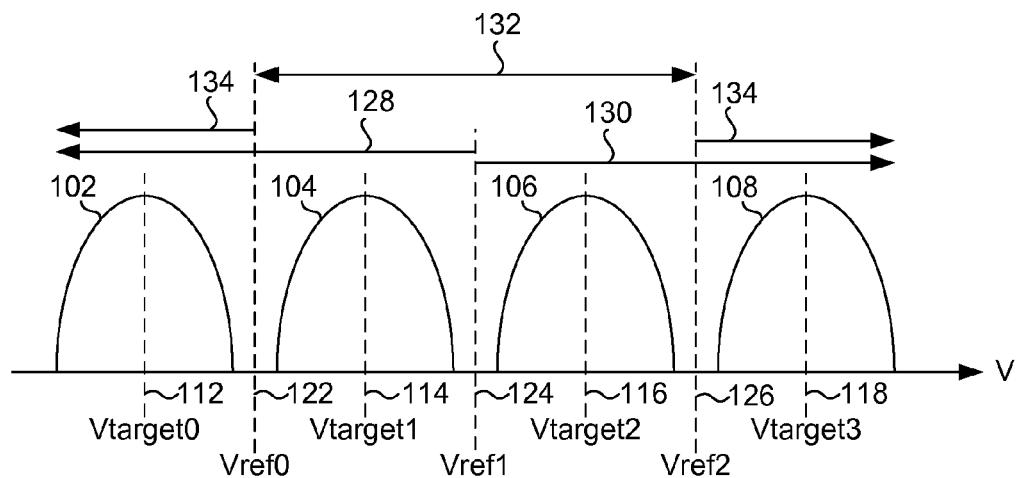
FIG. 1 is a plot of cell voltage distributions in a flash memory, as known in the art.
Figure 2:
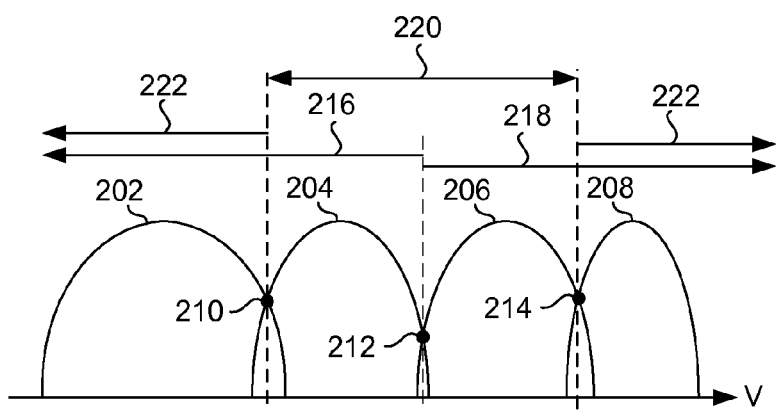
FIG. 2 is a plot of flash memory cell voltage distributions, showing the cross-points between them.

As illustrated in FIG. 2, in an illustrative or exemplary embodiment of the invention, four MLC NAND flash memory voltage distributions 202, 204, 206 and 208 are characterized by cross-points 210, 212 and 214. Cross-point 210 represents a voltage where voltage distributions 202 and 204 cross or overlap each other. Cross-point 212 represents a voltage where voltage distributions 204 and 206 cross or overlap each other. Cross-point 214 represents a voltage where voltage distributions 206 and 208 cross or overlap each other. (Note that FIG. 2 is not to scale, and the extent of the overlap is highly exaggerated for emphasis.) Cross-point 210 can be used to determine a voltage window 216. Cross-points 210 and 212 can be used to determine a voltage window 218. Cross-points 212 and 214 can be used to determine a voltage window 220. Cross-point 214 can be used to determine a voltage window 222. Cross-points 210, 212 and 214 thus can be used to aid detection of read data.

Figure 3:
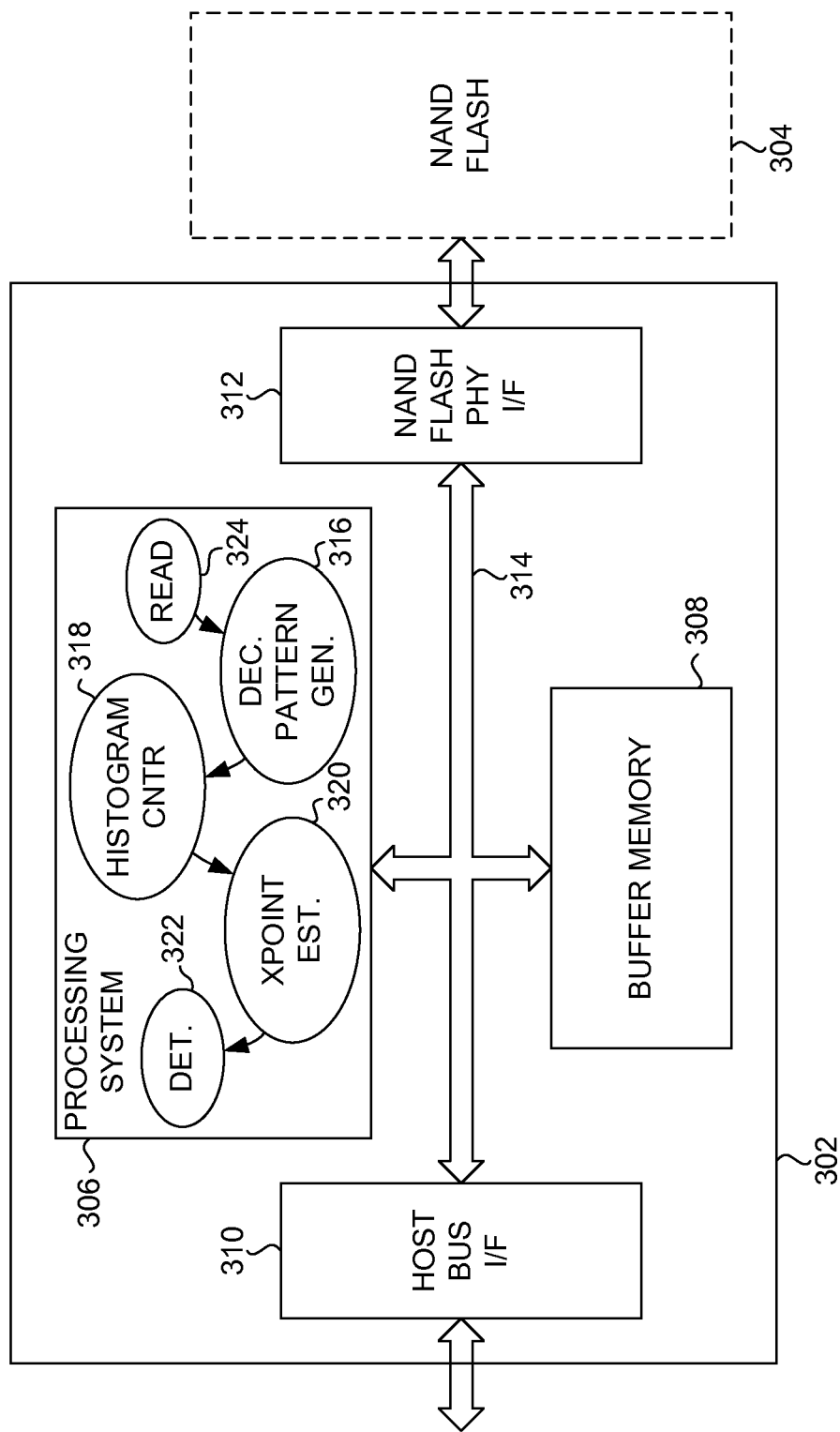
FIG. 3 is a block diagram of a flash memory controller, in accordance with an exemplary embodiment of the invention.

As illustrated in FIG. 3, in the exemplary embodiment a flash memory controller 302 can determine cross-points 210, 212 and 214 (FIG. 2) in an MLC NAND flash memory device 304 and use this information to aid detection of read data. In other embodiments (not shown), such a flash memory controller can determine similar cross-points in other types of flash memory devices. Although only one flash memory device 304 is shown for purposes of clarity, flash memory controller 302 can control multiple flash memory devices. Flash memory controller 302 includes a processing system 306, a buffer memory 308, a host bus interface 310, and a NAND flash physical interface 312. Flash memory controller 302 can include additional elements, such as those that are commonly included in conventional flash memory controllers, but such other elements are not shown for purposes of clarity. The foregoing elements are interconnected by a data bus 314. Host bus interface 310 is used to interface flash memory controller 302 to an external system (not shown), such as a computer. Host bus interface 310 can be of any suitable conventional type. As such a host bus interface 310 is well understood by persons skilled in the art, it is not described herein in further detail. NAND flash physical interface 312 is used in the exemplary embodiment to interface flash memory controller 302 to MLC NAND flash memory device 304 and can be of any suitable conventional type. As such a NAND flash physical interface 312 is well understood by persons skilled in the art, it is not described herein in further detail. Buffer memory 308 is used to temporarily store data that is read from MLC NAND flash memory device 304 and can be of any suitable conventional type, such as static random access memory.

Although not shown for purposes of clarity, processing system 306 can comprise one or more suitable processors, such as central processing units, digital signal processors or other specialized processors, etc., and suitable memory from which such processors execute instructions. Processing system 306 can comprise any suitable combination of hardware, software, firmware, etc. Conceptually shown for illustrative purposes as residing in processing system 306 are a number of logic elements: decision pattern logic 316, histogram logic 318, cross-point estimator logic 320, and read data detection logic 322, as well as read logic 324 for generally coordinating the reading of data from MLC NAND flash memory device 304 in response to requests received via host bus interface 310. Such logic elements can be defined by hardware logic, by execution of software or firmware (instructions) by a processor, or by any other suitable means. Such logic elements configure processing system 306 to effect the method described below. Other logic elements with which processing system 306 may be configured but which are not shown for purposes of clarity include error-correcting code (ECC) logic, wear leveling logic, read retry logic, and other logic of the types commonly included in flash memory controllers.

Figure 5:
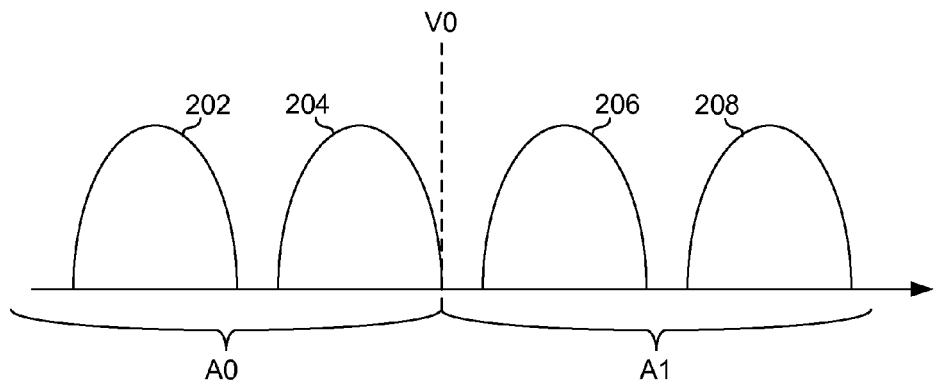
FIG. 5 is a plot of flash memory cell voltage distributions and one candidate reference voltage used in the exemplary method in relation to determining a cell voltage distribution cross-point associated with an LSB of a memory cell.

Referring briefly to FIG. 2, it can be noted that voltage windows 216 and 218 and thus cross-point 212 serve as the criteria for detecting the LSB of the read data that is read from a cell. With further reference to an example shown in FIG. 5, similar voltage windows A0 and A1 and thus cross-point 212 (not shown in FIG. 5 because the method has not yet determined its location) serve as the criteria for detecting the LSB. If a single candidate reference voltage V0 is used to read a single cell, the read data (LSB) is characterized as a "1" if the cell voltage is less than V0, i.e., in the voltage range or decision region A0, and characterized as a "0" if the cell voltage is greater than V0, i.e., in the voltage range or decision region A1. Thus, for the ordered set of decision regions {A0, A1} there is an ordered set of corresponding decision patterns {1, 0}.

Figure 6:
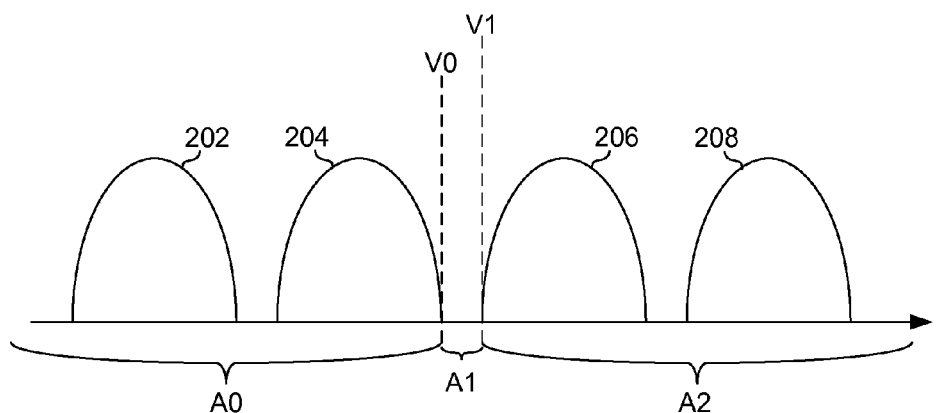
FIG. 6 is a plot of flash memory cell voltage distributions and two candidate reference voltages used in the exemplary method in relation to determining a cell voltage distribution cross-point associated with an LSB of a memory cell.

In another example, shown in FIG. 6, voltage windows A0, A1 and A2, which similarly relate to cross-point 212 (not shown in FIG. 6 because the method has not yet determined its location) serve as further criteria for detecting the LSB. A first candidate reference voltage V0 is used to read a cell, and a second candidate reference voltage V1 that is incrementally greater than V0 is used to read the same cell. If the cell voltage is less than V0, i.e., in the voltage range or decision region A0, then the read data (LSB) that is produced in response to the use of the first candidate reference voltage V0 is characterized as a "1", and the read data (LSB) that is produced in response to the use of the second candidate reference voltage V1 is characterized as a "1". If the cell voltage is between V0 and V1, i.e., in the voltage range or decision region A1, then the read data (LSB) that is produced in response to the use of the first candidate reference voltage V0 is characterized as a "0", and the read data (LSB) that is produced in response to the use of the second candidate reference voltage V1 is characterized as a "1". If the cell voltage is greater than V1, i.e., in the voltage range or decision region A2, then the read data (LSB) that is produced in response to the use of the first candidate reference voltage V0 is characterized as a "0", and the read data (LSB) that is produced in response to the use of the second candidate reference voltage V1 is characterized as a "0". Thus, for the ordered set of decision regions {A0, A1, A2} there is an ordered set of three corresponding two-bit decision patterns {11, 01, 00}. The left bit in each two-bit decision pattern corresponds to the use of the first candidate reference voltage V0, and the right bit in each two-bit decision pattern corresponds to the use of the second candidate reference voltage V1.

Figure 7:
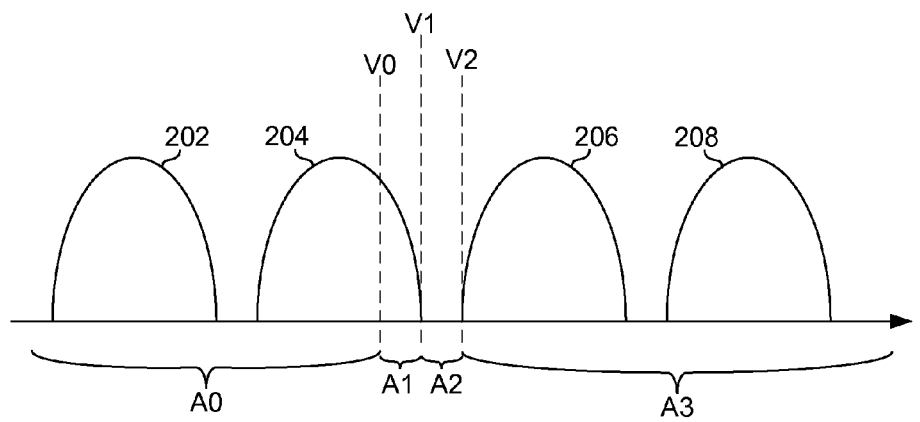
FIG. 7 is a plot of flash memory cell voltage distributions and three candidate reference voltages used in the exemplary method in relation to determining a cell voltage distribution cross-point associated with an LSB of a memory cell.

In still another example, shown in FIG. 7, voltage windows A0, A1, A2 and A3, which similarly relate to cross-point 212 (not shown in FIG. 6 because the method has not yet determined its location) serve as further criteria for detecting the LSB. A first candidate reference voltage V0 is used to read a cell, a second candidate reference voltage V1 that is incrementally greater than V0 is used to read the same cell, and a third candidate reference voltage V2 that is incrementally greater than V1 is also used to read the same cell. If the cell voltage is less than V0, i.e., in the voltage range or decision region A0, then the read data (LSB) that is produced in response to the use of the first candidate reference voltage V0 is characterized as a "1", the read data (LSB) that is produced in response to the use of the second candidate reference voltage V1 is characterized as a "1", and the read data (LSB) that is produced in response to the use of the third candidate reference voltage V2 is characterized as a "1". If the cell voltage is between V0 and V1, i.e., in the voltage range or decision region A1, then the read data (LSB) that is produced in response to the use of the first candidate reference voltage V0 is characterized as a "0", the read data (LSB) that is produced in response to the use of the second candidate reference voltage V1 is characterized as a "1", and the read data (LSB) that is produced in response to the use of the third candidate reference voltage V2 is characterized as a "1". If the cell voltage is between V1 and V2, i.e., in the voltage range or decision region A2, then the read data (LSB) that is produced in response to the use of the first candidate reference voltage V0 is characterized as a "0", the read data (LSB) that is produced in response to the use of the second candidate reference voltage V1 is characterized as a "0", and the read data (LSB) that is produced in response to the use of the third candidate reference voltage V2 is characterized as a "1". If the cell voltage is greater than V2, i.e., in the voltage range or decision region A3, then the read data (LSB) that is produced in response to the use of the first candidate reference voltage V0 is characterized as a "0", the read data (LSB) that is produced in response to the use of the second candidate reference voltage V1 is characterized as a "0", and the read data (LSB) that is produced in response to the use of the third candidate reference voltage V2 is characterized as a "0". Thus, for the ordered set of decision regions {A0, A1, A2} there is an ordered set of four corresponding three-bit decision patterns {111, 011, 001, 000}. The leftmost bit in each three-bit decision pattern corresponds to the use of the first candidate reference voltage V0, the middle bit in each three-bit decision pattern corresponds to the use of the second candidate reference voltage V1, and the rightmost bit in each three-bit decision pattern corresponds to the use of the third candidate reference voltage V2.

Figure 8:
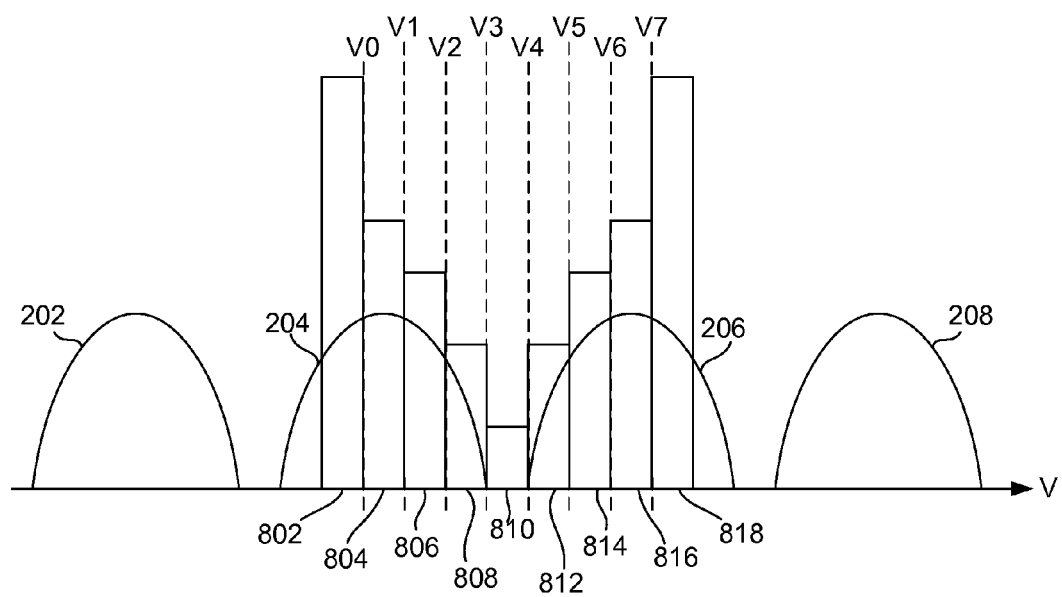
FIG. 8 is a plot of flash memory cell voltage distributions, eight candidate reference voltages, and nine histogram bars used in the exemplary method in relation to determining a cell voltage distribution cross-point associated with an LSB of a memory cell.

In the same manner described above with regard to FIGS. 5-7, flash memory controller 302 can use, for example, eight candidate reference voltages V0-V7 (i.e., N=8) to read data from a portion (e.g., one or more pages) of MLC NAND flash memory device 304, as illustrated by the example shown in FIG. 8. Note that the eight candidate reference voltages V0-V7 span a range, which can be approximately centered between the target cell voltages specified by the manufacturer of MLC NAND flash memory device 304 for reference voltage distributions 204 and 206, as these target cell voltages generally approximate the means of cell voltage distributions 204 and 206. Also note that a suitable voltage increment or delta between successive voltages in the sequence (i.e., the width of each voltage region) such as between V0 and V1, between V1 and V2, between V2 and V3, etc., readily can be determined (e.g., empirically) by one skilled in the art. Although for purposes of illustration in the exemplary embodiment the voltage delta is uniform, in other embodiments there can be non-uniform or different voltage deltas between different pairs of adjacent candidate reference voltages. Also, although for purposes of illustration in the exemplary embodiment the candidate reference voltage is incremented such that successive voltages in the sequence are incrementally greater than each other, in other embodiments the candidate reference voltages can be incremented or decremented. A sequence could alternate or otherwise vary between a voltage greater than a value centered between target cell voltages and a voltage less than that value. For example: {0.4V, −0.1V, −0.05V, 0.1V, 0.3V}, where "0" represents the center between target cell voltages.

Figure 4:
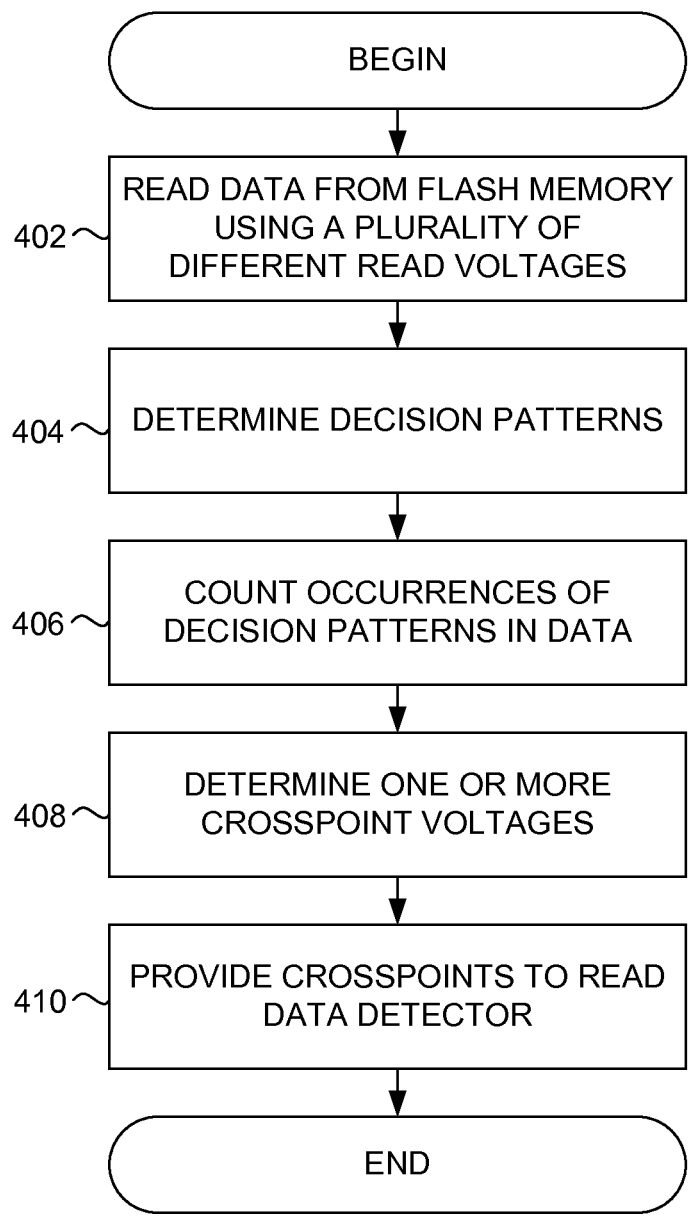
FIG. 4 is a flow diagram illustrating an exemplary method of operation of the flash memory controller of FIG. 3, in accordance with the exemplary embodiment.

As illustrated in FIG. 4, a method of operation is represented by blocks 402, 404, 406, 408 and 410. As indicated by block 402, flash memory controller 302 (FIG. 3) reads one or more pages of data from MLC NAND flash memory device 304 using a plurality of candidate reference voltages. That is, flash memory controller 302 reads each cell of each of one or more pages N times, each time using a different candidate reference voltage, where N is an integer greater than one. Flash memory controller 302 can temporarily store this read data in its buffer memory 308. Read logic 324 (FIG. 3) can contribute to the configuration of processing system 306 to effect these aspects of the method.

As the method is described herein with respect to the example shown in FIG. 8, N=8 in this example. Note that, as in the examples described above with regard to FIGS. 5-7, flash memory controller 302 reads the cells of the one or more pages in an attempt to determine cross-point 212 (not shown in FIG. 8 because the method has not yet determined its location).

As indicated by block 404, flash memory controller 302 determines a plurality of decision patterns of the type described above with regard to FIGS. 5-7. Decision pattern logic 316 (FIG. 3) can contribute to the configuration of processing system 306 to effect these aspects of the method. As described above, each such decision pattern corresponds to a voltage region bordering one of the candidate reference voltages. Note that reading a cell eight times using eight different candidate reference voltages V0-V7 corresponds to nine decision patterns. Also note that each set of decision patterns follows a Gray code pattern. For N reads there are N+1 decision patterns.

As indicated by block 406, flash memory controller 302 counts the number of times each decision pattern occurs in the read data that has been stored in buffer memory 308. Histogram counter logic 318 (FIG. 3) can contribute to the configuration of processing system 306 to effect these aspects of the method. Referring briefly again to FIG. 8, each of the nine decision patterns (not enumerated for purposes of clarity) in this example corresponds to a decision region or voltage region bordering at least one of the candidate reference voltages V0-V7. The decision regions or voltage regions are not shown in FIG. 8 for purposes of clarity but are the same in principle as those described above with regard to FIGS. 5-7 (e.g., A0, A1, A2, A3, etc.). Note in FIG. 8 that each decision region (and thus each decision pattern) also conceptually corresponds to one of nine histogram bars 802, 804, 806, 808, 810, 812, 814, 816 and 818. The width of each of histogram bars 802-818 is the width of the voltage regions between adjacent candidate reference voltages, i.e., the above-referenced candidate reference voltage increment. Histogram bar 802 represents the count of the number of times the decision pattern corresponding to the voltage region less than V0 occurs in the read data. Histogram bar 804 represents the count of the number of times the decision pattern corresponding to the voltage region between V0 and V1 occurs in the read data. Histogram bar 806 represents the count of the number of times the decision pattern corresponding to the voltage region between V1 and V2 occurs in the read data. Histogram bar 808 represents the count of the number of times the decision pattern corresponding to the voltage region between V2 and V3 occurs in the read data. Histogram bar 810 represents the count of the number of times the decision pattern corresponding to the voltage region between V3 and V4 occurs in the read data. Histogram bar 812 represents the count of the number of times the decision pattern corresponding to the voltage region between V4 and V5 occurs in the read data. Histogram bar 814 represents the count of the number of times the decision pattern corresponding to the voltage region between V5 and V6 occurs in the read data. Histogram bar 816 represents the count of the number of times the decision pattern corresponding to the voltage region between V6 and V7 occurs in the read data. Histogram bar 818 represents the count of the number of times the decision pattern corresponding to the voltage region greater than V7 occurs in the read data.

Flash memory controller 302 maintains or stores these counts (conceptually, histogram bars) for further processing described below with regard to block 408. Note that the greater the count, the longer the histogram bar to which it conceptually corresponds. For example, the decision patterns corresponding to histogram bars 802 and 818 appear to occur more frequently than the decision patterns corresponding to histogram bars 802-818, as the lengths of histogram bars 802 and 818 are greater than the lengths of histogram bars 804-816. Note that in this example histogram bar 810 is the shortest among histogram bars 802-818.

Figure 9:
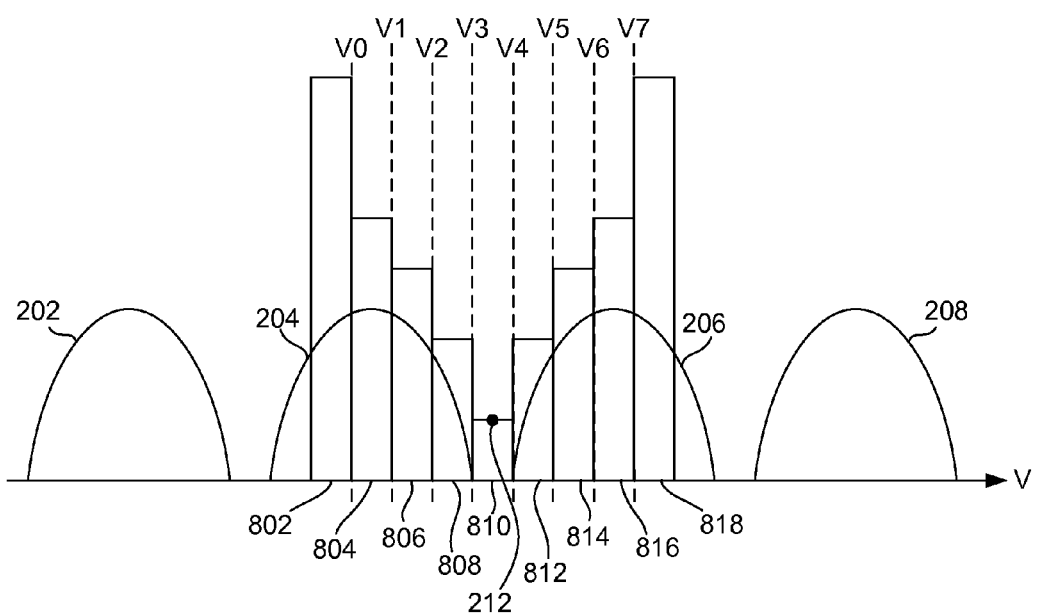
FIG. 9 is similar to FIG. 8, showing an example of a cross-point determined in accordance with the exemplary method.

As indicated by block 408, flash memory controller 302 can use the above-described counts (i.e., decision pattern frequency) to determine cross-point 212. The lowest count (or pair of counts if two are equally the shortest) serves as an indicator of the location of a cross-point. Correspondingly, the shortest histogram bar (or two or more histogram bars if they are equally the shortest) serves as an indicator of the location of a cross-point. Thus, in the example shown in FIG. 8, histogram bar 810 serves as an indicator of the location of cross-point 212. In an instance in which there is one histogram bar that is shorter than all others, flash memory controller 302 can compute its midpoint as an estimate of the location of the cross-point. As shown in FIG. 9, in this example flash memory controller 302 computes the midpoint of histogram bar 810 as an estimate of the location (i.e., voltage) of cross-point 212. In an instance (not shown) in which two or more histogram bars are equally the shortest, the cross-point can be estimated to lie at a mid-point of those histogram bars.

As indicated by block 410, flash memory controller 302 can use the estimated location of cross-point 212 in a conventional manner to aid detection of further data read from MLC NAND flash memory device 304, since cross-point 212 determines the voltage windows 218 and 220 (FIG. 2) in connection with detecting the LSB read from a cell. Read data detection logic 322 (FIG. 3) can contribute to the configuration of processing system 306 to effect these aspects of the method. Persons skilled in the art can appreciate that read data detection logic 322 can represent hard detection or, in other embodiments, soft detection.

The method is described above with regard to determining the location of cross-point 212. Cross-point 212 is relevant to detecting the LSB read from a cell of MLC NAND flash memory device 304. However, persons skilled in the art understand that essentially the same method can be used to determine the locations of cross-points 210 and 214, which are relevant to detecting the MSB read from a cell of MLC NAND flash memory device 304. In connection with determining cross-points 210 and 214, reading a cell N times using N different pairs of candidate reference voltages corresponds to 2N decision patterns, since a pair of candidate reference voltages are used to read each cell. The method is not described in similar detail with regard to an example involving cross-points 210 and 214, as persons skilled in the art are readily capable of providing a suitable method and flash memory controller or similar system to effect such a method. Nevertheless, the following example described with regard to FIG. 10 may be useful. For purposes of clarity, in the following example only three different candidate reference voltages are used. However, more generally, N different candidate reference voltages can be used as described above.

Figure 10:
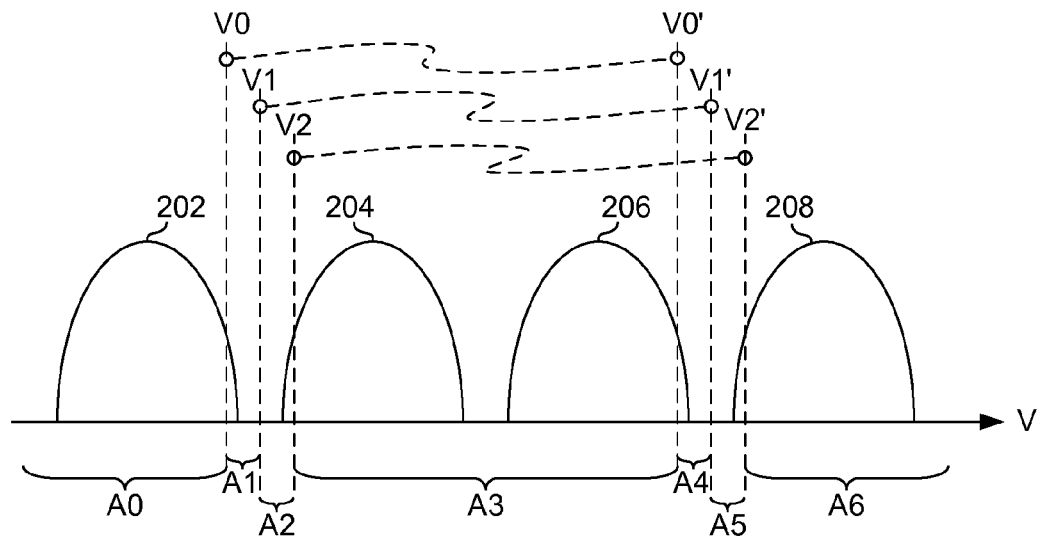
FIG. 10 is a plot of flash memory cell voltage distributions and three candidate reference voltages used in the exemplary method in relation to determining two cell voltage distribution cross-points associated with an MSB of a memory cell.

As illustrated in FIG. 10, voltage windows A0, A1, A2, A3, A4, A5 and A6, which relate to above-described cross-points 210 and 214 (not shown in FIG. 10 because the method has not yet determined their location), serve as criteria for detecting the MSB stored in a cell. Each cell is read three times in this example. A first pair of candidate reference voltages V0 and V0' are used to read a cell, a second pair of candidate reference voltages V1 and V1' are used to read the same cell, and a third pair of candidate reference voltages V2 and V2' are also used to read the same cell. Note that the first voltage in each pair relates to cross-point 210, and the second voltage (denoted by the prime symbol) relates to cross-point 214. The second voltage in each pair can be greater than the first voltage by a fixed amount or increment. Note that each cell need only be read N times in order to determine both of cross-points 210 and 214. Reading a cell, for example, three times using three pairs of candidate reference voltages corresponds to seven decision patterns. For the ordered set of seven decision regions {A0, A1, A2, A3, A4, A5 and A6} there is an ordered set of seven corresponding three-bit decision patterns {111, 011, 001, 000, 100, 110, 111}. Note that since Gray coding is used, the same decision pattern that corresponds to decision region A0 also corresponds to decision region A6. Thus, for N reads there are 2N decision patterns. The leftmost bit in each three-bit decision pattern corresponds to the use of the first candidate reference voltage V0, the middle bit in each three-bit decision pattern corresponds to the use of the second candidate reference voltage V1, and the rightmost bit in each three-bit decision pattern corresponds to the use of the third candidate reference voltage V2. As in the examples described above, in this example each decision pattern corresponds to a voltage region bordering one of the candidate reference voltages. The corresponding histograms are not shown in FIG. 10 for purposes of clarity.

The same method described above with regard to FIG. 4 can be used to determine cross-points 210 and 214. That is, flash memory controller 302 reads each cell of each of one or more pages N times, each time using a different pair of candidate reference voltages, where N is an integer greater than one, as described above with regard to block 402. Then, flash memory controller 302 uses this read data to determine the decision patterns, as described above with regard to block 404. Flash memory controller 302 then counts the number of times each decision pattern occurs in the read data, as described above with regard to block 406.

Figure 11:
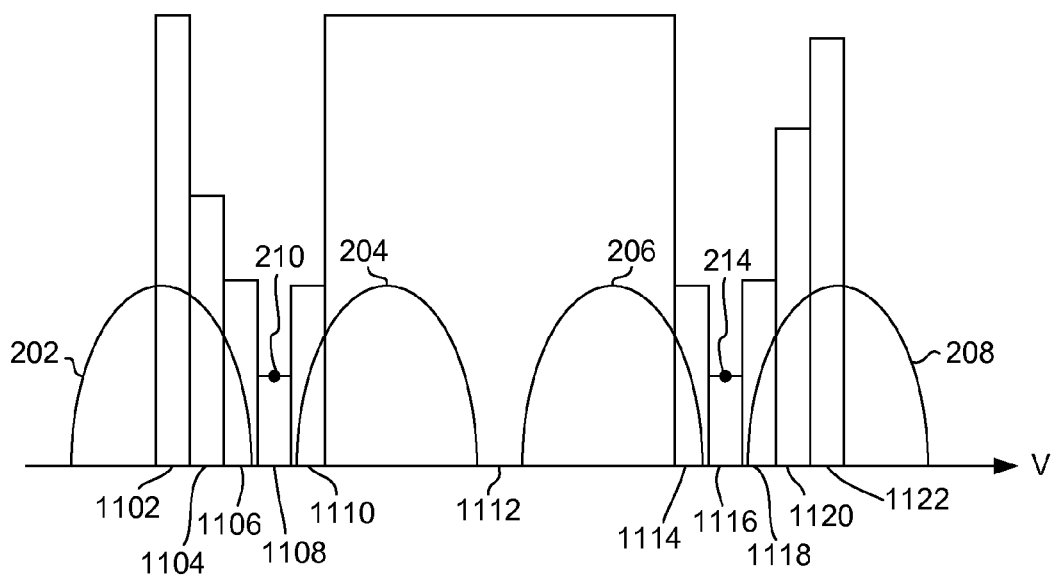
FIG. 11 is a plot of flash memory cell voltage distributions and eleven histogram bars used in the exemplary method in relation to determining two cell voltage distribution cross-points associated with an MSB of a memory cell.

Although histograms are not shown in FIG. 10 for purposes of clarity, another example is shown in FIG. 11 in which eleven histogram bars 1102, 1104, 1106, 1108, 1110, 1112, 1114, 1116, 1118, 1120 and 1122 are shown as conceptually corresponding to eleven voltage regions (and thus ten decision patterns). Accordingly, the example shown in FIG. 11 relates to an instance in which five pairs of candidate reference voltages, V0 and V0', V1 and V1', V2 and V2', V3 and V3', and V4 and V4', are used to read each cell.

As described above with regard to block 408, flash memory controller 302 can use the counts (i.e., decision pattern frequency) to determine cross-points 210 and 214. In the example shown in FIG. 11, two counts, represented by histogram bars 1108 and 1116, respectively, are lower than the other counts. Therefore, these counts serve as indicators of the locations of cross-points 210 and 214, respectively. Flash memory controller 302 can compute the midpoints of histogram bars 1108 and 1116 as estimates of the locations of cross-points 210 and 214, respectively.

It should be noted that method described above with regard to FIG. 4 need only be performed two times to determine the three cross-point voltages of an MLC flash memory. That is, the method need be performed only once to determine the cross-point voltage relating to reading the LSB (i.e., cross-point 212 in the above-described examples) and only once to determine both of the cross-point voltages relating to reading the MSB (i.e., cross-points 210 and 214 in the above-described examples). With respect to the MSB, each cell need only be read N times using N different pairs of candidate reference voltages. As described above, for the N reads relating to the MSB there are 2N decision patterns. Thus, when the method of FIG. 4 is performed to determine the two cross-point voltages relating to reading the MSB, the memory need only be read N times, and only 2N decision patterns need be determined. Accordingly, it can be noted that employing decision patterns enables multiple cross-point voltages to be determined with a minimum of read operations.

Flash memory controller 302 can effect the above-described method (i.e., cause it to occur) periodically during operation of a system (not shown) in which MLC NAND flash memory device 304 is included, or at any other suitable time, such as each time the system is powered up. Thus, flash memory controller 302 can help minimize the adverse effect of reference voltages changing over time due to changes in temperature, interference from programming neighboring cells, numerous erase-program cycles, etc.

It should be understood that the flow diagram of FIG. 4 is intended only to be exemplary or illustrative of the logic underlying the above-described method. In view of the descriptions herein, persons skilled in the art readily will be capable of programming or configuring a flash memory controller or similar system in any of various ways to effect the above-described method and similar methods. Blocks 402-410 are intended only as examples, and in other embodiments the steps or acts described above with regard to blocks 402-410 and similar steps or acts can occur in any other suitable order or sequence. Steps or acts described above with regard to blocks 402-410 and similar steps or acts can be combined with others or omitted in some embodiments. Similarly, logic elements 316-324 (FIG. 3) are intended only as examples, and the logic underlying the above-described method can be modularized in any other suitable manner. In view of the descriptions herein, persons skilled in the art will readily be capable of programming or configuring flash memory controller 302 with suitable software or in suitable logic, such as in the form of an application-specific integrated circuit (ASIC) or similar device or combination of devices, to effect the above-described method and similar methods. Also, it should be understood that the combination of software instructions or similar logic and the memory in which such software instructions or similar logic is stored or embodied for execution in processing system 306, comprises a "computer-readable medium" or "computer program product" as that term is used in the patent lexicon.

It should be noted that the invention has been described with reference to one or more exemplary embodiments for the purpose of demonstrating the principles and concepts of the invention. The invention is not limited to these embodiments. For example, although the above-described exemplary embodiment relates to MLC NAND flash memory, other embodiments can relate to SLC, TLC or any other suitable type of flash memory. As will be understood by persons skilled in the art, in view of the description provided herein, many variations may be made to the embodiments described herein and all such variations are within the scope of the invention.

What is claimed is:

1. A method for flash memory controller operation, comprising:
reading data from a portion of a flash memory a plurality of times using a plurality of different candidate reference voltages, each time reading data from the portion of the flash memory using a different candidate reference voltage from all other times, the plurality of different candidate reference voltages distributed over a voltage range, the voltage range centered on an estimated mid-point between a pair of adjacent target cell voltages;
determining a plurality of decision patterns, each decision pattern corresponding to a voltage region bordering one of the candidate reference voltages;
counting occurrences of each of the plurality of decision patterns in the data read from the portion of the flash memory;
determining one or more of the decision patterns having a minimum of occurrences;
determining a cross-point voltage corresponding to a mid-point of one or more voltage regions corresponding to the one or more decision patterns determined to have a minimum of occurrences; and
providing an indication of the cross-point voltage to a read data detector.

2. The method of claim 1, wherein:
reading data from a portion of a flash memory a plurality of times using a plurality of different candidate reference voltages comprises reading data from a portion of a flash memory N times using N different candidate reference voltages, where N is an integer greater than one; and
determining a plurality of decision patterns comprises determining N+1 decision patterns.

3. The method of claim 1, wherein:
reading data from a portion of a flash memory a plurality of times using a plurality of different candidate reference voltages comprises reading data from a portion of a flash memory N times using N different pairs of candidate reference voltages, where N is an integer greater than one; and
determining a plurality of decision patterns comprises determining 2N decision patterns.

4. The method of claim 1, wherein the method is performed two times to determine three cross-point voltages of a multi-level cell (MLC) flash memory having four target cell voltages.

5. The method of claim 1, wherein reading data from a portion of a flash memory a plurality of times comprises reading data using the estimated mid-point between two target cell voltages and reading data using incrementally higher and lower candidate reference voltages from the estimated mid-point.

6. The method of claim 1, wherein all voltage regions are equal to each other in width.

7. The method of claim 3, wherein N=8.

8. A flash memory controller, comprising:
a buffer memory;
a processing system comprising:
read logic for reading data into the buffer memory from a portion of a flash memory a plurality of times using a plurality of different candidate reference voltages, each time reading data from the portion of the flash memory using a different candidate reference voltage from all other times, the plurality of different candidate reference voltages distributed over a voltage range, the voltage range centered on an estimated mid-point between a pair of adjacent target cell voltages;
decision pattern logic for determining a plurality of decision patterns, each decision pattern corresponding to a voltage region bordering one of the candidate reference voltages;
histogram logic for counting occurrences of each of the plurality of decision patterns in the data read from the portion of the flash memory, the decision pattern logic further determining one or more decision patterns having a minimum of occurrences;
cross-point estimation logic for determining a cross-point voltage corresponding to a mid-point of one or more voltage regions corresponding to the one or more decision patterns determined to have a minimum of occurrences; and
read data detection logic for receiving from the cross-point estimation logic an indication of the cross-point voltage.

9. The flash memory controller of claim 8, wherein:
the read logic reads data from the portion of a flash memory N times using N different candidate reference voltages, where N is an integer greater than one; and
the decision pattern logic determines N+1 decision patterns.

10. The flash memory controller of claim 8, wherein:
the read logic reads data from the portion of a flash memory N times using N different pairs of candidate reference voltages, where N is an integer greater than one; and
the decision pattern logic determines 2N decision patterns.

11. The flash memory controller of claim 8, wherein three cross-point voltages of a multi-level cell (MLC) flash memory having four target cell voltages are determined.

12. The flash memory controller of claim 8, wherein reading data into the buffer memory from a portion of a flash memory a plurality of times comprises reading data using the estimated mid-point between two target cell voltages and reading data using incrementally higher and lower candidate reference voltages from the estimated mid-point.

13. The flash memory controller of claim 8, wherein all voltage regions are equal to each other in width.

14. The flash memory controller of claim 10, wherein N=8.

15. A computer program product for flash memory control, the computer program product comprising a computer-readable medium having stored therein in computer-executable non-transitory form instructions that, when executed on a processing system of a flash memory controller, cause the processing system to effect a method comprising:
reading data from a portion of a flash memory a plurality of times using a plurality of different candidate reference voltages, each time reading data from the portion of the flash memory using a different candidate reference voltage from all other times, the plurality of different candidate reference voltages distributed over a voltage range, the voltage range centered on an estimated mid-point between a pair of adjacent target cell voltages;
determining a plurality of decision patterns, each decision pattern corresponding to a voltage region bordering one of the candidate reference voltages;
counting occurrences of each of the plurality of decision patterns in the data read from the portion of the flash memory;
determining one or more decision patterns having a minimum of occurrences;
determining a cross-point voltage corresponding to a mid-point of one or more voltage regions corresponding to the one or more decision patterns determined to have a minimum of occurrences; and
providing an indication of the cross-point voltage to a read data detector.

16. The computer program product of claim 15, wherein:
reading data from a portion of a flash memory a plurality of times using a plurality of different candidate reference voltages comprises reading data from a portion of a flash memory N times using N different candidate reference voltages, where N is an integer greater than one; and
determining a plurality of decision patterns comprises determining N+1 decision patterns.

17. The computer program product of claim 15, wherein the instructions cause the processing system to effect the method two times to determine three cross-point voltages of a multi-level cell (MLC) flash memory having four target cell voltages.

18. The computer program product of claim 15, wherein reading data from a portion of a flash memory a plurality of times comprises reading data using the estimated mid-point between two target cell voltages and reading data using incrementally higher and lower candidate reference voltages from the estimated mid-point.

19. The computer program product of claim 15, wherein all voltage regions are equal to each other in width.

20. The computer program product of claim 15, wherein N=8.

\* \* \* \* \*